United States Patent [19]
Epstein et al.

[11] Patent Number: 5,552,657
[45] Date of Patent: Sep. 3, 1996

[54] GENERATION OF ELECTRICAL ENERGY BY WEIGHTED, RESILIENT PIEZOELECTRIC ELEMENTS

[75] Inventors: Michael Y. Epstein, Belle Mead; George W. Taylor, Princeton, both of N.J.

[73] Assignee: Ocean Power Technologies, Inc., West Trenton, N.J.

[21] Appl. No.: 388,557

[22] Filed: Feb. 14, 1995

[51] Int. Cl.[6] .................................................. H01L 41/08
[52] U.S. Cl. ........................ 310/339; 310/329; 310/367; 310/800; 60/497; 290/53
[58] Field of Search ................................ 310/328, 329, 310/338, 339, 800, 367; 290/42, 53; 60/495, 497

[56] References Cited

U.S. PATENT DOCUMENTS

| | | | |
|---|---|---|---|
| 3,336,529 | 8/1967 | Tygart | 310/328 |
| 3,900,748 | 8/1975 | Adler | 310/367 |
| 4,048,526 | 9/1977 | Taylor | 310/329 |
| 4,051,395 | 9/1977 | Taylor | 310/329 |
| 4,051,397 | 9/1977 | Taylor | 310/800 X |
| 4,110,630 | 8/1978 | Hendel | 290/53 |
| 4,317,047 | 2/1982 | de Almada | 290/53 |
| 4,404,490 | 9/1983 | Taylor et al. | 310/339 |
| 4,685,296 | 8/1987 | Burns | 60/497 |
| 4,742,241 | 5/1988 | Melvin | 290/53 |
| 4,794,295 | 12/1988 | Penneck et al. | 310/800 X |

*Primary Examiner*—Mark O. Budd
*Attorney, Agent, or Firm*—Michael Y. Epstein

[57] ABSTRACT

Disposed within a float on the surface of a body of water is a vertically suspended, resilient piezoelectric element provided with a preselected strain by a hanging weight. The piezoelectric system functions as a weighted coiled spring which is driven into oscillation in response to movements of the float in response to passing surface waves. Preferably, the natural frequency of the system is selected in correspondence with the frequency of the passing waves for causing the system to oscillate in resonance with the passing waves. Additionally, a mechanism is provided for automatically adjusting the natural frequency of the system in response to changing wave conditions for maintaining the system in resonance with the waves.

5 Claims, 1 Drawing Sheet

5,552,657

GENERATION OF ELECTRICAL ENERGY BY WEIGHTED, RESILIENT PIEZOELECTRIC ELEMENTS

BACKGROUND OF THE INVENTION

This invention relates to the generation of electrical energy by piezoelectric elements, and particularly to the generation of electricity by weighted, spring-like piezoelectric elements having particular utility, among other uses, for generating electricity for use in navigation buoys.

Navigation buoys and the like are frequently provided with lights and/or horns for signaling the presence of the buoys to passing vessels. The buoys are preferably unattended for extended periods of time and relatively large and expensive battery systems are disposed within the buoys for providing electrical energy. In recent years, attempts have been made to provide automatic recharging of the batteries by photovoltaic energy generators which convert sunlight to electrical energy. Such systems tend to be expensive and, particularly in salt water environments, the sun absorbing surfaces tend to become quickly coated with light blocking salts and the like.

A need exists, therefore, for means for charging the batteries on a continuous basis for greatly extending the periods between maintenance visits, and preferably by a charging means which can be isolated from surrounding hostile conditions. Such need is satisfied by the present invention which utilizes piezoelectric elements within the buoy.

The use of piezoelectric elements within buoys and floats of various kinds for generating electrical energy is known. In general, the prior known systems include massive elements mounted for reciprocating movements in response to wave induced rocking motions of the floats. By various means, the kinetic energy gained by the massive elements is transferred to piezoelectric elements for the generation of electrical energy. The various energy absorbing and converting systems heretofore used are quite inefficient and thus relatively impractical. The present invention provides a far more efficient and practical system. In copending U.S. patent application entitled, "Piezoelectric Generation of Electrical Power From Surface Waves in Bodies of Water Using Suspended Weighted Members", filed by M. Y. Epstein, there is disclosed, among other things, the use of a float from which is suspended a weighted piezoelectric element. The system functions as a weighted spring which oscillates, preferably in resonance, in response to vertical movements of the float in response to passing surface waves. The present invention is based upon the invention disclosed in such co-pending application, the subject matter of which is incorporated herein by reference.

SUMMARY OF THE INVENTION

Disposed within a float on the surface of a body of water is a vertically suspended, resilient piezoelectric element provided with a preselected strain by a hanging weight. The piezoelectric system functions as a weighted coiled spring which is driven into oscillation in response to movements of the float in response to passing surface waves. Preferably, the natural frequency of the system is selected in correspondence with the frequency of the passing waves for causing the system to oscillate in resonance with the passing waves. Additionally, means are provided for automatically adjusting the natural frequency of the system in response to changing wave conditions for maintaining the system in resonance with the waves.

DESCRIPTION OF PREFERRED EMBODIMENTS

Figure 1:
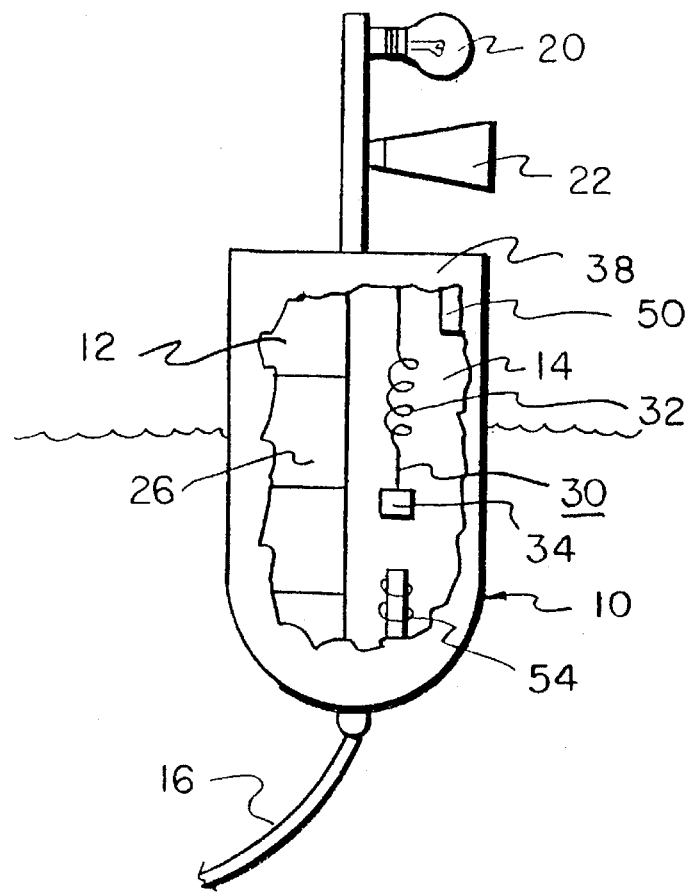
FIG. 1 is a side elevation, partly broken away, of a buoy containing a piezoelectric electrical generator in accordance with this invention.

FIG. 1 shows the inventive system used with a typical navigation buoy 10. As presently used, buoys of the type shown in FIG. 1 are relatively large and contain hollow spaces 12 and 14 therewithin. The buoy 10 is anchored in place by means of a cable 16 secured to an anchor (not shown) or the like. For signaling the presence of the buoy, one or both of an electric light 20 and an electrically driven horn 22 are mounted on the buoy. Electrical power for the light and horn is provided by a battery 26 disposed in the space 12. In accordance with this invention, a system 30 for generating electricity for trickle charging the battery 26 is disposed in the other space 14.

The system 30 comprises a resilient element 32 formed from a piezoelectric material and a weight 34 hung from the bottom end of the spring 32. The upper end of the element is secured to the upper wall 38 of the buoy space 14.

The resilient element 32 can have various configurations, e.g., a suspended, electroded layer or laminate of layers of piezoelectric material such as shown in U.S. Pat. No. 4,404,490 to Burns and Taylor, the subject matter of which is incorporated herein by reference. Alternatively, as shown in FIG. 1, the resilient element 32 can comprise a coiled spring formed from a cable-like piezoelectric element.

Figure 2:
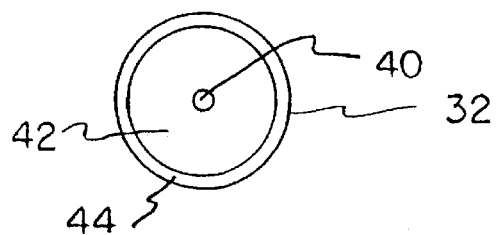
FIG. 2 is a cross-section, or an enlarged scale, of a cable used in the generator shown in FIG. 1.

A cross section of a piezoelectric cable 32 is shown in FIG. 2. The cable 32 comprises a central electrode 40 in the form of an elongated metal rod, e.g., of stainless steel, a surrounding layer 42 of a piezoelectric material, and a surrounding metal electrode 44, e.g., a thin layer of tin or aluminum or a mesh woven from small diameter stainless steel wires.

Because the piezoelectric system functions as an oscillating spring, the piezoelectric material of the layer 42 must be flexible. Preferred piezoelectric materials are known PVDF polymers. PVDF stands for polyvinylidene fluoride. By "PVDF polymers" is meant either the PVDF polymer by itself or various copolymers comprising PVDF and other polymers, e.g., a copolymer referred to P(VDF-TrFE) and comprising PVDF and PTrFE (polytrifluoroethylene).

As known, the natural frequency of oscillation of a coiled spring is a function of the "stiffness" of the spring, that is, the force required for a unit elongation of the spring, and the total mass or weight of the spring which includes both the weight of the spring itself and that of the weight 34 hung therefrom.

By varying various parameters, e.g., the material and/or the diameter of the central rod 40, the material and/or the thickness of the layer 42, the pitch of the coiled piezoelectric cable 32, and the weight of the weight 34, the system can be designed to have a natural frequency of oscillation selected from an extremely wide range of possible frequencies. The actual frequency selected is a function of where the buoy is to be used, and, preferably corresponds to the frequency of the waves most commonly present at such location. In deep ocean water, for example, typical surface waves have a frequency of 0.1 Hz. In shallower water, the surface waves have higher frequencies.

In use of the system 30, oscillations occur in response to movements of the buoy 10. The oscillations cause alternating straining and de-straining of the piezoelectric material layer 42 and the attendant generation of electrical energy which is collected between the central electrode 40 and the outer electrode 44. The output energy is a function of the mass of the piezoelectric material and the degree of alternating straining thereof in terms both of the range of straining and the frequency thereof.

The maximum energy output of the system occurs when the piezoelectric element 32 is oscillating in resonance with the movements of the buoy. The buoy 10, of course, responds to all water surface movement, but the largest amplitude vertical displacements of the buoy occur in response to the passage of the crests and troughs of long wavelength surface waves. Accordingly, the system 30 is preferably designed to have a natural frequency sufficiently close to that of the frequency of passing surface waves to cause oscillation of the system in resonance with such passing waves. As known, maximum amplitude oscillations and maximum absorption of energy by an oscillating system occur during such resonance operation.

Of course, even if the system is not in a resonance condition, oscillation of the system occurs in response to any movements of the buoy, and electrical energy is produced.

In accordance with one embodiment of the invention, a study is first made of the wave conditions at a selected buoy location, and the system is designed with a natural frequency of oscillation based upon the frequency of the waves most prevalent at the location. Using known rectifier and energy control means, the a.c. electrical energy generated by the system is converted to a form most suitable for trickle charging the batteries 26 contained within the space 12 of the buoy 10. During periods when the electrical energy being generated is less than the amount being consumed by the buoy electrical systems, the shortage of energy is supplied from the batteries.

Clearly, to the extent that the system operates always at its maximum efficiency, the size of the battery storage system and the cost thereof can be reduced. This can be achieved to the extent that the system can be continuously tuned so that its instantaneous natural frequency varies in correspondence with variations in the surface wave conditions. Continuous tuning of the inventive systems is now described.

As previously described, the natural frequency of oscillation of a weighted coil is a function of the stiffness of the coil and its effective weight. One means for tuning the system, in response to changes in the frequency of the passing waves, comprises varying the weight of the weight 34.

Figure 3:
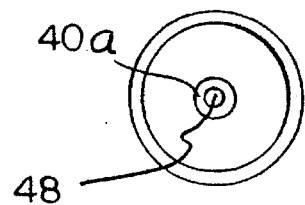
FIG. 3 shows a modification of the cable shown in FIG. 2.

One means for accomplishing this is the use of a hollow weight 34 and means for adding or subtracting water from within the weight. FIG. 3 shows, for example, a modification of the cable 32 shown in FIG. 2 wherein a central electrode 40a is a hollow metal tubing providing a path 48 for water to and from the weight 34. Water is pumped into and out of the hollow weight by means, for example, of a pump 50 shown in FIG. 1 mounted within the buoy 10.

Another means for controlling the frequency of oscillation of the system is by means of a controlled magnetic field. To this end, the weight 34 is of a magnetic material, e.g., iron, and an electrically controlled magnet 54 is disposed at the bottom of the space 14.

Two methods of magnetic control are described.

In one method, a controlled d.c. magnetic field is present which either adds to or subtracts from the gravitational force on the weight 34, thereby changing the effective weight of the weight 34.

In another method, the magnetic field is operated in a pulse mode, wherein the frequency of the pulses corresponds to the frequency of the passing waves. Thus, the system is effectively "pumped" by the periodic pulses which controls the frequency of oscillation of the system.

Proper tuning of the system can be done on a trial and error basis. For example, at spaced apart intervals, the magnetic field produced by the magnet 54 is varied either in magnitude or pulse frequency, and the effect on the output energy of the system is monitored. Further changes are either made or not made dependent upon whether the energy output is increased or decreased.

In another arrangement, the frequency of the output energy is monitored, which frequency is a function of the passing waves, and the system is tuned in response to detected variations in the surface wave frequency.

As described, a preferred use of the invention is in connection with navigation buoys where various movements of the buoys in response to passing waves induce oscillations of the weighted, piezoelectric spring system within the buoys. Weighted springs can be driven, or "pumped" by various mechanical sources, and piezoelectric systems such as the system 30 shown in FIG. 1 can be used in other environments. For example, a weighted, stretched spring piezoelectric element system identical to the system 30 can be suspended from a support structure subject to vibratory movements in response to passing fluids, e.g., water in a stream or air past a wire or tree branch and the like. The support vibrations cause oscillations of the resilient piezoelectric elements, of whatever configuration, whereby electrical energy is generated.

What is claimed is:

1. A power generating system comprising a hollow float for floating on a surface of a body of water and being movable in response to movements of the surface of the water, a resilient piezoelectric power generating element in the form of a coiled spring for being suspended within said float for oscillations of said element in response to float movements, and a weight member for being suspended from said element within said float for driving said element into said oscillations.

2. A system according to claim 1 wherein said spring is formed from a cable comprising an elongated, central electrode surrounded by a layer of piezoelectric material surrounded, in turn, by an outer electrode.

3. A power generating system comprising a hollow float for floating on a surface of a body of water and being movable in response to movements of the surface of the water, a resilient piezoelectric power generating element for being suspended within said float for oscillations of said element in response to float movements, a hollow weight member for being suspended from said element within said float for driving said element into said oscillations, and means for passing a weighting substance into and out of said weight member for varying the weight thereof.

4. A system according to claim 3 including a pump for pumping water from the body of water into and out of said weight.

5. A power generating system comprising a hollow float for floating on a surface of a body of water and being movable in response to movements of the surface of the water, a resilient piezoelectric power generating element for being suspended within said float for oscillations of said element in response to float movements, a weight member for being suspended from said element within said float for driving said element into said oscillations, and magnetic means for controlling the rate of oscillation of said element.

\* \* \* \* \*